United States Patent
Yu et al.

(10) Patent No.: US 11,147,182 B2
(45) Date of Patent: Oct. 12, 2021

(54) ANTI-JAMMING CHASSIS

(71) Applicant: HONGFUJIN PRECISION ELECTRONICS(TIANJIN)CO.,LTD., Tianjin (CN)

(72) Inventors: Mo-Ming Yu, Tianjin (CN); Jin-Liang Li, Tianjin (CN); Bo-Quan Cheng, Tianjin (CN)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 99 days.

(21) Appl. No.: 16/571,484

(22) Filed: Sep. 16, 2019

(65) Prior Publication Data
US 2021/0068295 A1 Mar. 4, 2021

(30) Foreign Application Priority Data
Aug. 28, 2019 (CN) .......................... 201910803390.9

(51) Int. Cl.
*H05K 7/14* (2006.01)

(52) U.S. Cl.
CPC .................................. *H05K 7/1488* (2013.01)

(58) Field of Classification Search
CPC ... H05K 7/1487; H05K 7/1488; H05K 7/1489
See application file for complete search history.

(56) References Cited

U.S. PATENT DOCUMENTS

| | | | |
|---|---|---|---|
| 5,975,659 A * | 11/1999 | Yang | G06F 1/181 312/223.2 |
| 7,193,856 B2 | 3/2007 | Hidaka | |
| 7,374,259 B2 * | 5/2008 | Wu | G06F 1/181 312/223.2 |
| 8,141,964 B1 * | 3/2012 | Yu | H05K 7/1487 312/223.2 |
| 10,416,732 B1 * | 9/2019 | Yu | G11B 33/02 |
| 2006/0039106 A1 * | 2/2006 | Hidaka | G11B 33/128 361/679.38 |
| 2008/0191590 A1 * | 8/2008 | Lin | G11B 33/128 312/223.2 |
| 2010/0007252 A1 * | 1/2010 | Liu | H05K 7/1487 312/223.2 |
| 2010/0026148 A1 * | 2/2010 | Zhang | H05K 7/1487 312/223.2 |

(Continued)

FOREIGN PATENT DOCUMENTS

CN 1741182 A 3/2006
TW M499034 U 4/2015

*Primary Examiner* — Matthew W Ing
(74) *Attorney, Agent, or Firm* — ScienBiziP, P.C.

(57) ABSTRACT

An anti jamming chassis includes a body, a first upper cover mounted on the body, and a second upper cover mounted on the body. The first upper cover includes a first main cover and a first support portion. The first main cover is parallel to and not coplanar with the first support portion. The second upper cover includes a second main cover and a second support portion. The second main cover is parallel to and not coplanar with the second support portion. A through hole is defined at a joint position of the second main cover and the second support portion. When the first upper cover and the second upper cover are connected, the first support portion passes through the through hole and supports the second main cover.

11 Claims, 5 Drawing Sheets

(56) References Cited

U.S. PATENT DOCUMENTS

| | | | | |
|---|---|---|---|---|
| 2010/0026149 A1* | 2/2010 | Zhang | .................... | G06F 1/181 |
| | | | | 312/223.2 |
| 2017/0280581 A1* | 9/2017 | Hesse | .................. | H05K 7/1487 |
| 2020/0344903 A1* | 10/2020 | Sauer | .................. | H05K 7/1487 |
| 2020/0375057 A1* | 11/2020 | Chang | ................. | H05K 7/1487 |

\* cited by examiner

ANTI-JAMMING CHASSIS

FIELD

The subject matter herein generally relates to a chassis, and more particularly to an anti jamming chassis for preventing jamming with a storage module mounted in the anti jamming chassis.

BACKGROUND

Generally, a server room includes a plurality of large storage modules movably mounted in a chassis. The chassis usually includes two or more upper covers so that one of the storage modules can be viewed at any time. However, at a connection position of two adjacent upper covers, the connection may be deformed by gravity or due to other items on the upper cover, which may increase a risk of jamming with the storage modules.

BRIEF DESCRIPTION OF THE DRAWINGS

Implementations of the present disclosure will now be described, by way of embodiments, with reference to the attached figures.

DETAILED DESCRIPTION

Figure 1:
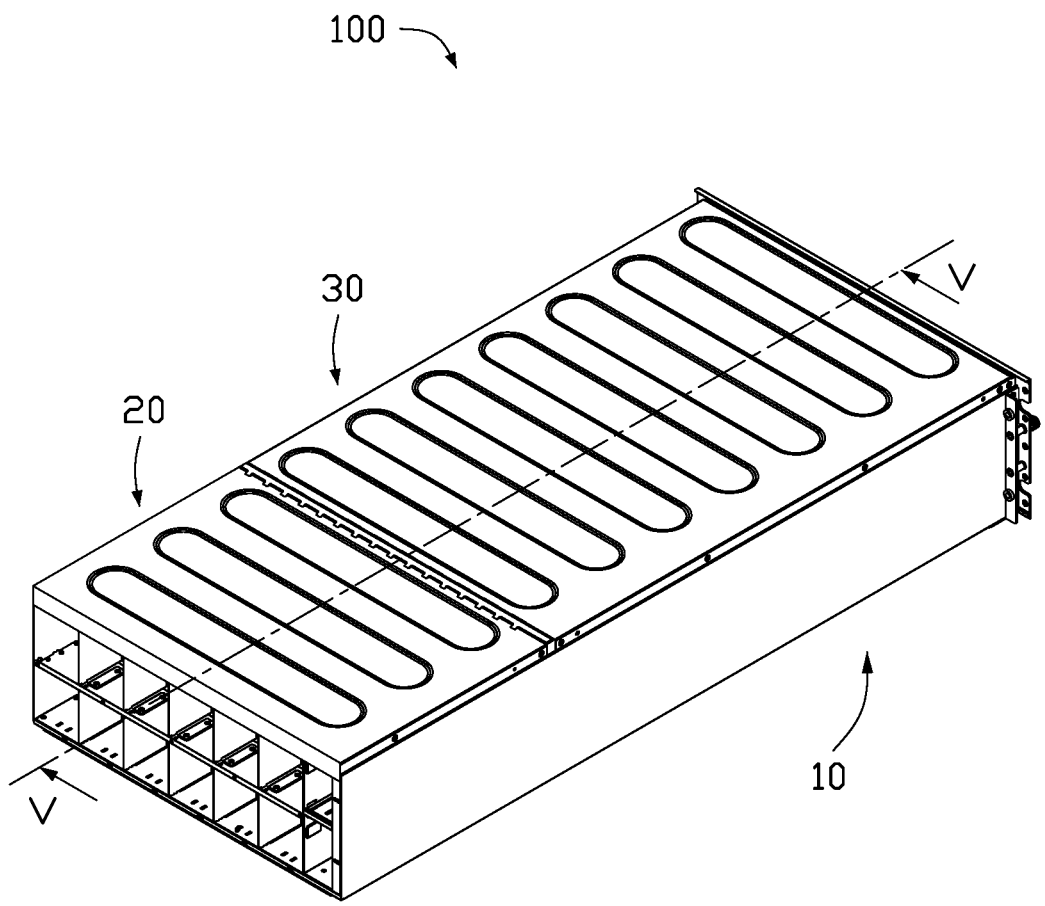
FIG. 1 is an assembled, isometric view of an embodiment of an anti jamming chassis.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

FIG. 1 shows an embodiment of an anti jamming chassis 100. The anti jamming chassis 100 prevents an upper cover of the anti jamming chassis 100 from jamming with a storage module mounted in the anti-jamming chassis 100.

Figure 2:
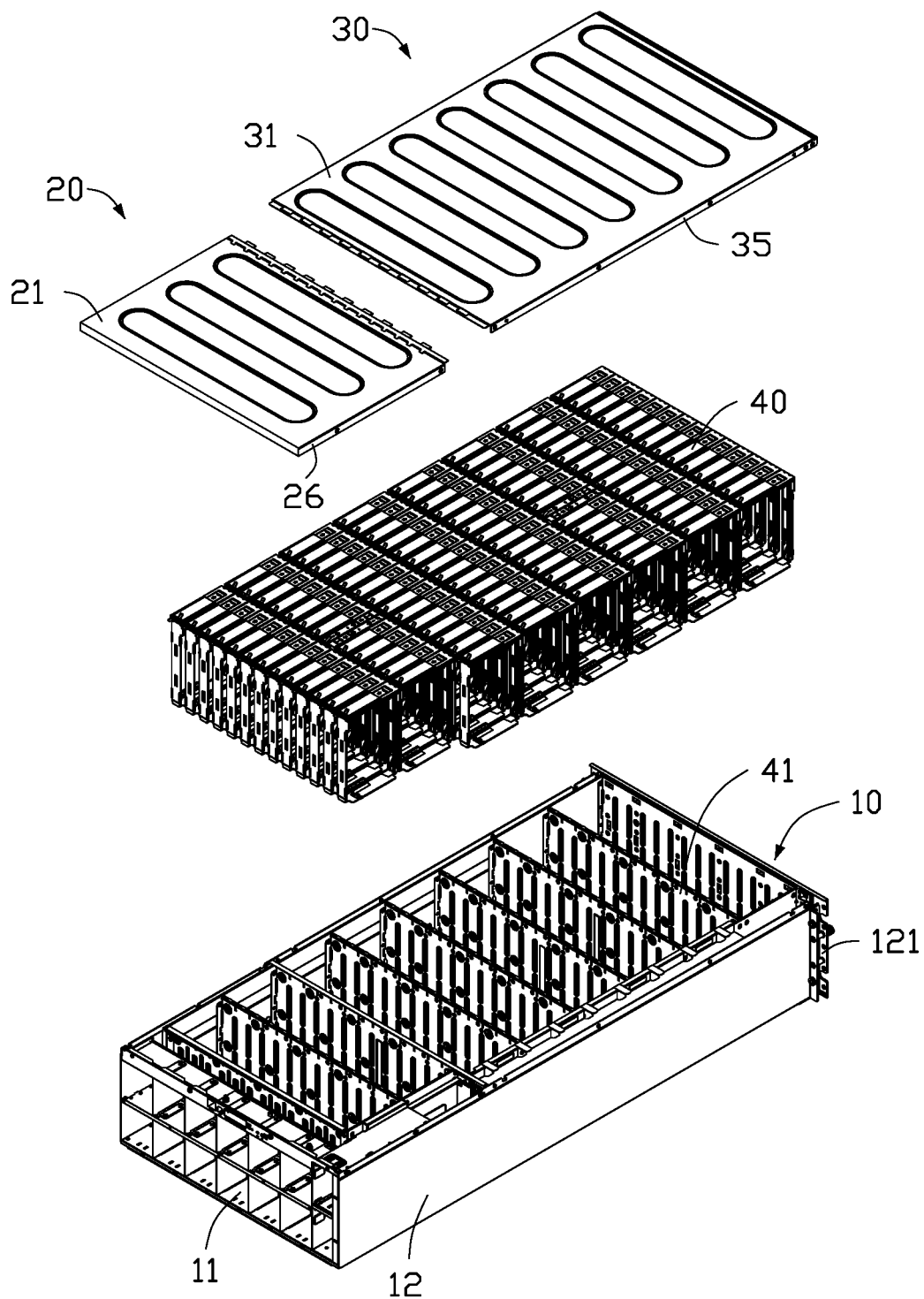
FIG. 2 is an exploded, isometric view of the anti jamming chassis in FIG. 1.
Figure 3:
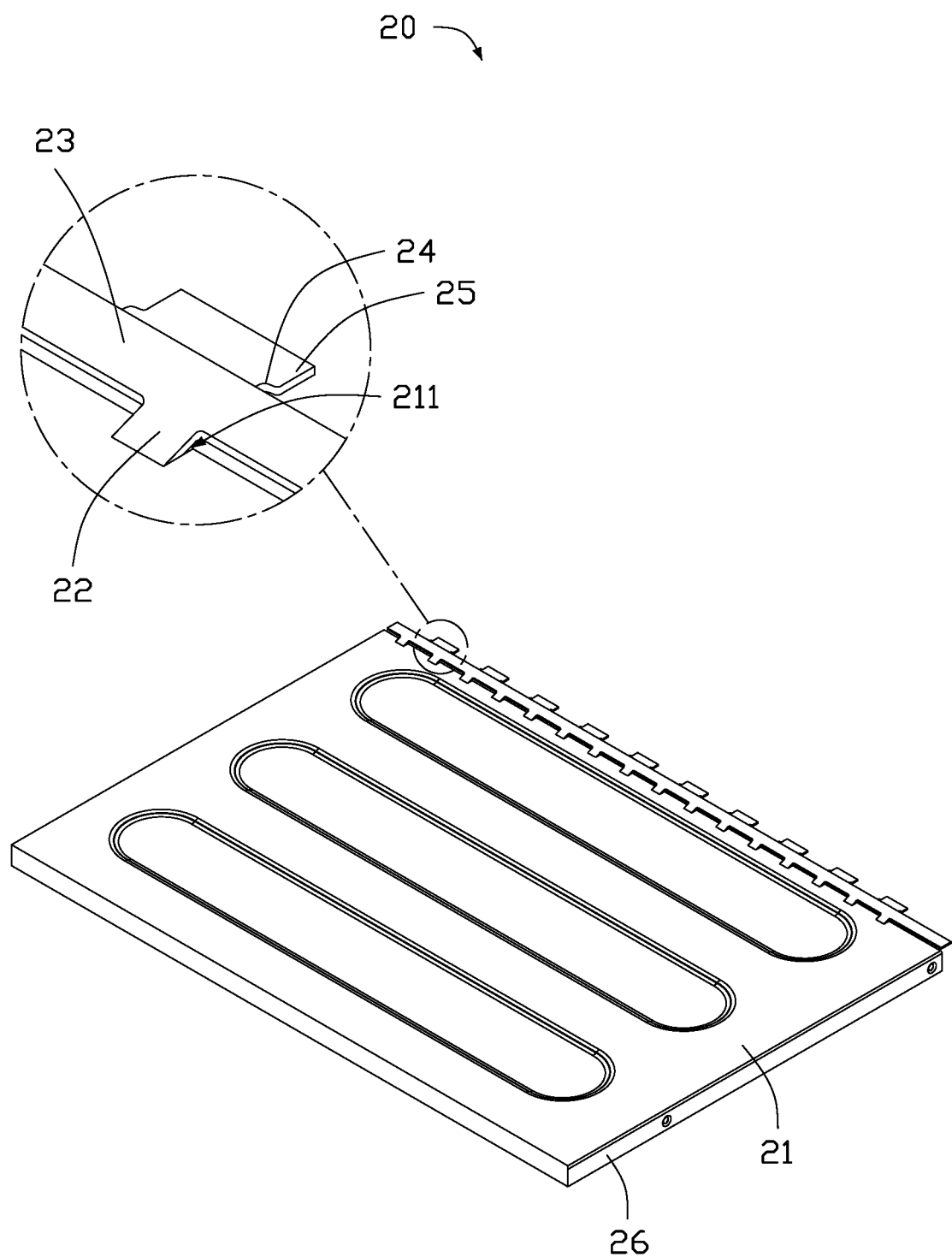
FIG. 3 is a close-up view of a first upper cover of the anti jamming chassis.
Figure 4:
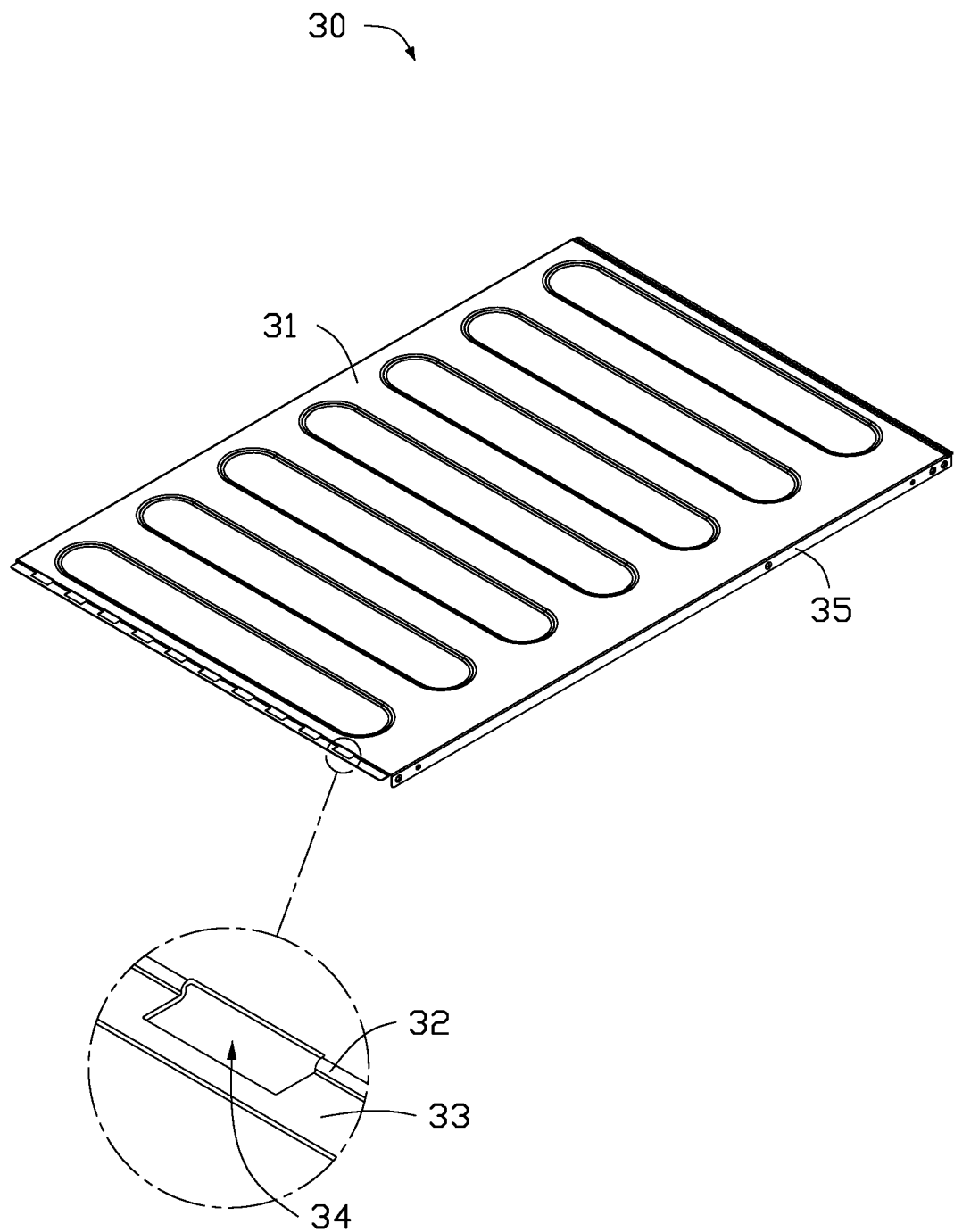
FIG. 4 is a close-up view of a second upper cover of the anti jamming chassis.

Referring to FIG. 2, FIG. 3, and FIG. 4, the anti jamming chassis 100 includes a body 10, a first upper cover 20, and a second upper cover 30. The first upper cover 20 and the second upper cover 30 are mounted on the body 10. The first upper cover 20 includes a first main cover 21 and an extension portion 23 located on a side of the first main cover 21 adjacent to the second upper cover 30. A first support portion 25 extends from the extension portion 23 toward the second upper cover 30. The second upper cover 30 includes a second main cover 31 and a second support portion 33 located on a side of the second main cover 31 adjacent to the first upper cover 20. A through hole 34 is defined at a joint position of the second main cover 31 and the second support portion 33.

When the first upper cover 20 and the second upper cover 30 are connected, the first support portion 25 passes through the through hole 34 and supports the second main cover 31, and the second support portion 33 supports the extension portion 23.

Referring to FIG. 2, the body 10 includes a bottom plate 11 and two side plates 12 connected to the bottom plate 11. The two side plates 12 are respectively located at opposite edges of the bottom plate 11 and are substantially perpendicular to the bottom plate 11. A shape and size of the body 10 is substantially the same as a shape and size of a storage module 40 to be mounted in the body 10. A fixing portion 121 is located at an end portion of the side plate 12 and extends away from the body 10. The fixing portion 121 is configured to fix the body 10 to a frame (not shown), such as by screws (not shown) or by welding to prevent the body 10 from moving together with the storage module 40 when the storage module 40 is removed.

Figure 5:
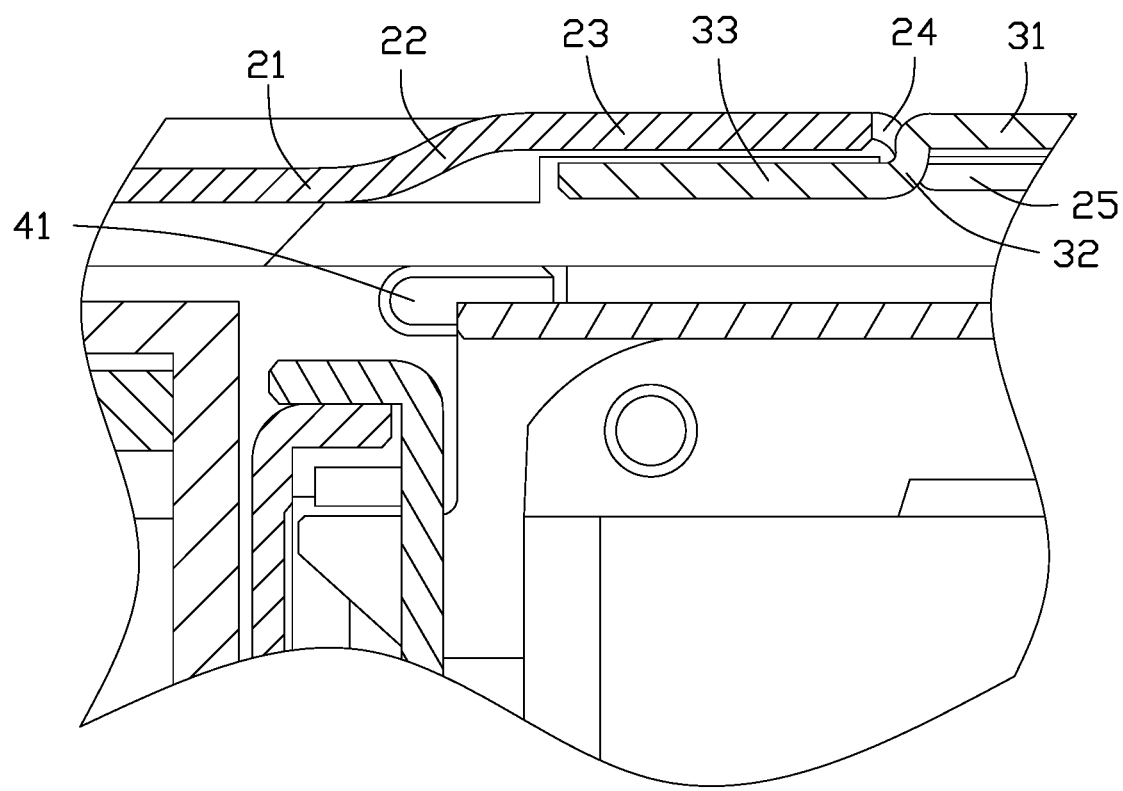
FIG. 5 is a cross-sectional view taken along line V-V in FIG. 1.

Referring to FIGS. 3 and 5, the first upper cover 20 further includes a first connection portion 22 and a second connection portion 24. The first main cover 21 is opposite to the bottom plate 11 when the first main cover 21 is mounted on the body 10. The first main cover 21 is coupled to the extension portion 23 by the first connection portion 22, and the extension portion 23 is coupled to the first support portion 25 by the second connection portion 24.

An edge of the first main cover 21 adjacent to the second upper cover 30 and the extension portion 23 cooperatively define a gap 211, and the first connection portion 22 extends a predetermined angle away from a plane of the first main cover 21 to couple to the extension portion 23 across the gap 211. The extension portion 23 coupled to the first connection portion 22 is substantially parallel to the first main cover 21 but not coplanar with the first main cover 21. An edge of the extension portion 23 away from the first connection portion 22 is coupled to the second connection portion 24. The second connection portion 24 extends a predetermined angle to couple to the first support portion 25, such that the first support portion 25 is coplanar with the first main cover 21.

In one embodiment, the first main cover 21 defines a plurality of the gaps 211 equidistantly spaced apart. Correspondingly, there is a plurality of the first connection portions 22 extending from the first main cover 21 to couple to the extension portion 23. The extension portion 23 cooperates with the first main cover plate 21 to cover the body 10. There is a plurality of the second connection portions 24 and a corresponding plurality of the first support portions 25. Each second connection portion 24 is coupled to the extension portion 23, and each of the second connection portions 24 is coupled to a corresponding first support portion 25. It one embodiment, the first upper cover 20 can be an integrally formed structure.

The first upper cover 20 further includes a first bent portion 26 substantially perpendicular to the first main cover 21 and extending from an edge of the first main cover 21. To mount the first upper cover 20 to the body 10, the first bent portion 26 contacts an outer side of the side plate 12, and the first bent portion 26 is fixed to the side plate 12 by a fixing means, such as by screws (not shown), to fix the first upper cover 20 on the body 10.

The second main cover 31 is opposite to the bottom plate 11 and covers the body 10 together with the first upper cover 20. Referring to FIG. 4, the second upper cover 30 further includes a third connection portion 32. The second main cover 31 is coupled to the second support portion 33 by the third connection portion 32. The third connection portion 32 extends a predetermined angle, such that the second main cover 31 and the second support portion 33 are coplanar. A through hole 34 is defined at a joint position of the third connection portion 32 and the second support portion 33. A quantity of the through hole 34 is equal to a quantity of the first support portions 25, and the through holes 34 correspond to the first support portions 25 one-to-one. In one embodiment, the second upper cover 30 can be integrally formed.

The second upper cover 30 further includes a second bent portion 35 substantially perpendicular to the second main cover 31 and extending from an edge of the second main cover 31. To mount the second upper cover 30 to the body 10, the second bent portion 35 contacts an outer side of the side plate 12, and the second bent portion 35 is fixed to the side plate 12 by a fixing means, such as by screws (not shown), to fix the second upper cover 30 on the body 10.

Referring to FIG. 1 and FIG. 5, in the anti jamming chassis 100, in order to prevent jamming between the storage module 40 and a connection position of the first upper cover 20 and the second upper cover 30, the first upper cover 20 and the second upper cover 30 are mutually supported by the first support portion 25 and the second support portion 33. Specifically, the first main cover 21, the first support portion 25, and the second support portion 33 are substantially coplanar, and the extension portion 23 and the second main cover 31 are substantially coplanar. The first support portion 25 passes through the through hole 34 to support the second main cover 31, and the second support portion 33 supports the extension portion 23. An X-shaped cross-sectional structure is formed by the extension portion 23, the first support portion 25, the second main cover 31, and the second support portion 33 to achieve mutual support, so that a connection joint of the first upper cover 20 and the second upper cover 30 does not lower over time due to gravity. A top end 41 of the storage module 40 is lower than a plane in which the first support portion 25 and the second support portion 33 are located.

In other embodiments, the anti jamming chassis 100 may include more than two upper covers. A connection structure between adjacent upper covers is described in the above manner.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. An anti jamming chassis comprising:
a body;
a first upper cover mounted on the body; and
a second upper cover mounted on the body; wherein:
the first upper cover comprises a first main cover, an extension portion, a first support portion, and a second connection portion;
the extension portion is located on a side of the first main cover adjacent to the second upper cover;
the first support portion extends from the extension portion toward the second upper cover;
the second upper cover comprises a second main cover and a second support portion;
the second support portion is located on a side of the second main cover adjacent to the first upper cover;
the extension portion is coupled to the first support portion by the second connection portion;
a through hole is defined at a joint position of the second main cover and the second support portion; and
when the first upper cover and the second upper cover are connected, the first support portion passes through the through hole and supports the second main cover, and the second support portion supports the extension portion.

2. The anti jamming chassis of claim 1, wherein:
the first upper cover further comprises a first connection portion; and
the first main cover is coupled to the extension portion by the first connection portion.

3. The anti jamming chassis of claim 2, wherein:
the first main cover is not coplanar with the extension portion; and
the first connection portion extends away from the body.

4. The anti-jamming as claimed in claim 1, wherein:
the extension portion is not coplanar with the first support portion; and
the second connection portion extends toward the body.

5. The anti jamming chassis of claim 1, wherein:
the second upper cover comprises a third connection portion; and
the second main cover is coupled to the second support portion by the third connection portion.

6. The anti jamming chassis of claim 5, wherein:
the second main cover is not coplanar with the second support portion; and
the third connection portion extends toward the body.

7. The anti jamming chassis of claim 1, wherein:
the body comprises a bottom plate and two side plates connected to the bottom plate; and
the two side plates are respectively located at opposite edges of the bottom plate.

8. The anti jamming chassis of claim 7, wherein:
the first upper cover further comprises a first bent portion extending from an edge of the first main cover;
the second upper cover further comprises a second bent portion extending from an edge of the second main cover;
the first upper cover is mounted to the body by fixing the first bent portion on an outer side of the side plate; and the second upper cover is mounted to the body by fixing the second bent portion on an outer side of the side plate.

9. The anti jamming chassis of claim 7, wherein:
each of the two side plates comprises a fixing portion for fixing the body to an external structure.

10. An anti jamming chassis comprising:
a body;
a first upper cover mounted on the body; and
a second upper cover mounted on the body; wherein:
the first upper cover comprises a first main cover, a first support portion and an extension portion;
the first main cover is parallel to and not coplanar with the first support portion;
the second upper cover comprises a second main cover and a second support portion;
the second main cover is parallel to and not coplanar with the second support portion;
a through hole is defined at a joint position of the second main cover and the second support portion;
the extension portion is located on a side of the first main cover adjacent to the second upper cover;
the first support portion extends from the extension portion; and
an edge of the first main cover adjacent to the second upper cover and the extension portion cooperatively define an opening;
the first connection portion extends a predetermined angle away from a plane of the first main cover to couple to the extension portion across the gap; and
the first support portion is coupled to the extension portion; and
when the first upper cover and the second upper cover are connected, the first support portion passes through the through hole and supports the second main cover, and the second support portion supports the extension portion.

11. The anti jamming chassis of claim 10, wherein:
the first upper cover further comprises a second connection portion coupled to an edge of the extension portion away from the first connection portion; and
the second connection portion extends a predetermined angle to couple to the first support portion, such that the first support portion is coplanar with the first main cover.

* * * * *